United States Patent
Gambino et al.

(10) Patent No.: US 6,259,129 B1
(45) Date of Patent: Jul. 10, 2001

(54) STRAP WITH INTRINSICALLY CONDUCTIVE BARRIER

(75) Inventors: Jeffrey P. Gambino, Gaylordsville, CT (US); Rajarao Jammy, Wappingers Falls, NY (US); Jack A. Mandelman, Stormville, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/295,133

(22) Filed: Apr. 20, 1999

(51) Int. Cl.[7] .................. H01L 27/108; H01L 29/76; H01L 29/94; H01L 31/119
(52) U.S. Cl. .................. 257/304; 257/301; 257/302; 257/303; 257/305; 257/306
(58) Field of Search ................. 257/301, 304, 257/305, 302, 303, 306, 296

(56) References Cited

U.S. PATENT DOCUMENTS

| | | | |
|---|---|---|---|
| 5,066,615 | 11/1991 | Brady et al. | 437/229 |
| 5,194,397 | 3/1993 | Cook et al. | 437/31 |
| 5,223,730 | * 6/1993 | Rhodes et al. | 257/301 |
| 5,283,453 | 2/1994 | Rajeevakumar | 257/304 |
| 5,395,786 | 3/1995 | Hsu et al. | 437/52 |
| 5,432,365 | * 7/1995 | Chin et al. | 257/301 |
| 5,434,109 | 7/1995 | Geissler et al. | 437/239 |
| 5,487,923 | 1/1996 | Min et al. | 427/569 |
| 5,489,544 | 2/1996 | Rajeevakumar | 437/52 |
| 5,512,767 | 4/1996 | Noble, Jr. | 257/301 |
| 5,576,566 | 11/1996 | Kenney | 257/301 |
| 5,656,535 | 8/1997 | Ho et al. | 438/386 |
| 5,677,219 | 10/1997 | Mazue et al. | 437/52 |
| 5,796,166 | 8/1998 | Agnello et al. | 257/751 |
| 5,869,868 | * 2/1999 | Rajeevakumar | 257/350 |
| 5,905,279 | * 5/1999 | Nitayama et al. | 257/301 |
| 5,981,332 | * 11/1999 | Mandelman et al. | 438/246 |

* cited by examiner

Primary Examiner—Eddie Lee
Assistant Examiner—Jesse A Fenty
(74) Attorney, Agent, or Firm—Steven Capella

(57) ABSTRACT

Reduced scale structures of improved reliability and/or increased composition options are enabled by the creation and use of intrinsically conductive recrystallization barrier layers. The intrinsically conductive layers are preferably used adjacent to conductive strap features in trench capacitors to act as recrystallization barriers.

14 Claims, 3 Drawing Sheets

STRAP WITH INTRINSICALLY CONDUCTIVE BARRIER

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. Attention must also be paid to the interaction of the various materials used in device construction during the device manufacture process, during device testing, and during device operation. In this regard, finer sized device components are more sensitive to adverse materials interactions since the amount of material forming the component is smaller. For example, an interaction that might have only affected the border area of a large component would affect an entire component of smaller scale (e.g., where the scale of the smaller component is the same size as the border area of the larger component). Thus, reduction in component scale forces consideration of materials interaction problems which could have been viewed as non-critical for larger scale components.

In the context of devices such as deep trench capacitors in semiconductor substrates, the various materials used to form the components of the capacitor such as the capacitor plates (electrodes), the dielectric barrier between electrodes, oxide collar structures to prevent or minimize parasitic effects, surface or buried straps to provide contact between the capacitor and the other circuitry of the device, etc. For example, the electrode in the trench is typically a highly doped polycrystalline silicon (polysilicon) material, the buried or surface strap is typically an amorphous silicon, and the semiconductor substrate is a monocrystalline silicon. The successful functioning of the capacitor depends in part on the ability of these diverse materials to maintain their original or desirably modified character during manufacture/useful life of the device.

Unfortunately, the nature of these materials is such that unwanted interactions may occur unless otherwise prevented.

For example, a problem may be caused by the difference in crystallinity (or grain size) between the monocrystalline silicon substrate and the amorphous or polycrystalline silicon trench electrode material, especially where there is an intervening amorphous silicon material. In such configurations, the amorphous or polysilicon layer may template on the monocrystalline surface and recrystallize. Often, defects are created at the interface with the monocrystalline silicon during recrystallization which may propagate into the monocrystalline silicon. The occurrence of such defects is believed to adversely affect memory cell performance (the memory cell containing the capacitor). Specifically, the defects are believed to cause a decrease in charge retention time and/or a lack of predictability of the charge retention time for the capacitor (so-called variable retention time). Such lack of predictability may limit the usefulness of the resulting device and/or the ability to maximize design performance and/or yield.

Thus, there is a desire for improved capacitor structures which allow better control of materials interactions to enable construction of reliable reduced scale devices. It is also desired to meet these needs in an economical manner that minimizes or avoids compromise of other device or component properties.

SUMMARY OF THE INVENTION

The invention provides technology which enables reduced scale capacitor structures of improved reliability. More specifically, the invention enables these benefits by the creation and use of intrinsically conductive barrier layers between regions of differing degrees of crystallinity (or differing grain size).

In one aspect, the invention encompasses a deep trench capacitor in a monocrystalline semiconductor substrate, the capacitor (i) comprising a buried plate in the substrate about an exterior portion of a trench in the substrate, (ii) a node dielectric about at least a lower interior portion of the trench, (iii) an electrode in the trench, and (iv) a conductive strap extending away from the trench electrode, at least a portion of the conductive strap being electrically connected to the trench electrode and the monocrystalline substrate, the capacitor further comprising (v) an intrinsically conductive barrier layer between the monocrystalline substrate and the trench electrode.

In another aspect, the invention encompasses methods of making trench capacitors containing intrinsically conductive barrier layers, the methods comprising depositing by chemical vapor deposition, physical vapor deposition or sputtering, an intrinsically conductive barrier layer.

Preferred intrinsically conductive barrier compounds are transition metal nitrides or transition metal silicon nitrides.

These and other aspects of the invention are described in further detail below.

DETAILED DESCRIPTION OF THE INVENTION

The invention provides intrinsically conductive barrier layers which are useful in control of stresses (e.g., associated with phase, lattice or thermal expansion mismatch, recrystallization or phase transformation) or other driving forces. The barrier layers may also act to inhibit or control diffusion of dopant species.

The invention provides trench capacitor structures containing one or more intrinsically conductive barriers at locations within the structure (i) between the strap and the monocrystalline substrate, and/or (ii) between the strap and the trench electrode. Examples of typical trench capacitor structures are shown in U.S. Pat. Nos. 5,283,453; 5,395,786; 5,434,109; 5,489,544; 5,512,767; 5,576,566; 5,656,535; and 5,677,219, the disclosures of which are incorporated herein by reference. The trench capacitor structures of the invention are not limited to any specific configuration.

Figure 1:
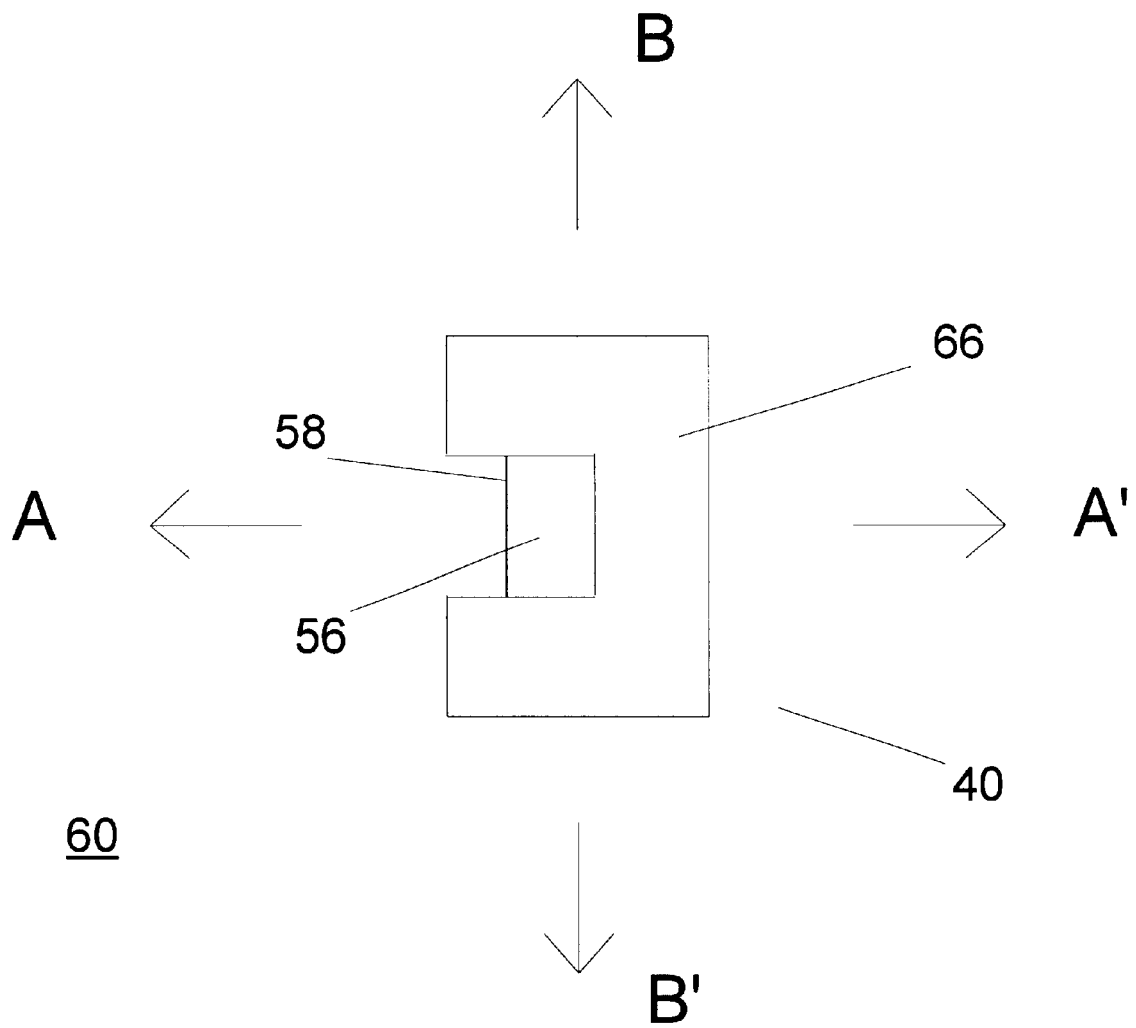
FIG. 1 is a schematic plan view of a deep trench capacitor taken from trench top level with the buried strap exposed.

FIG. 1 shows a schematic plan view of a typical trench capacitor structure 40 taken at the top of the trench in substrate 60 with the buried strap 56 exposed to reveal interface 58 between substrate 60 and strap 56. Shallow trench isolation (STI) 66 surrounds the top area of capacitor 40 on three sides.

Figure 2:
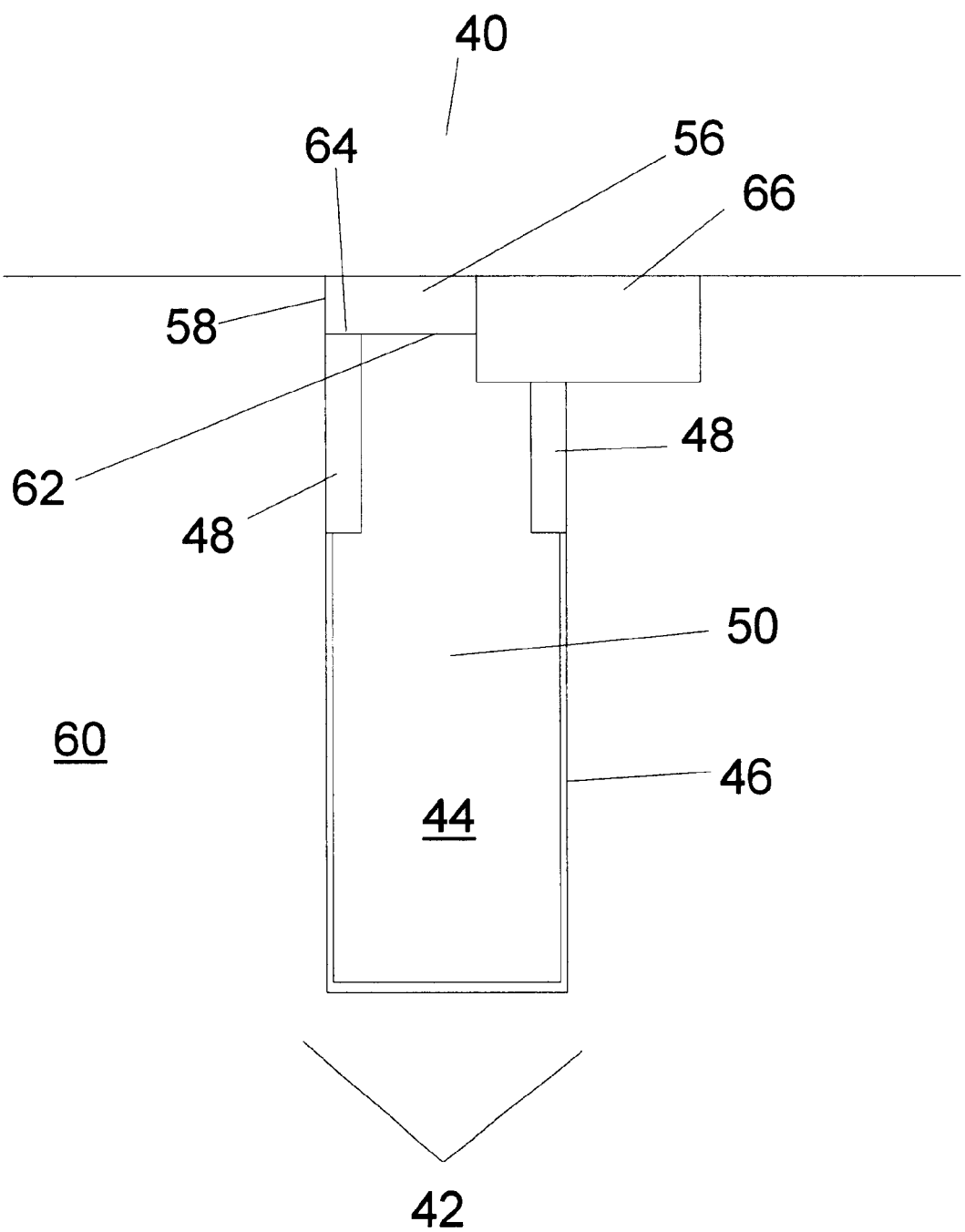
FIG. 2 is a schematic cross section of the deep trench capacitor structure of FIG. 1 at line A–A'.
Figure 3:
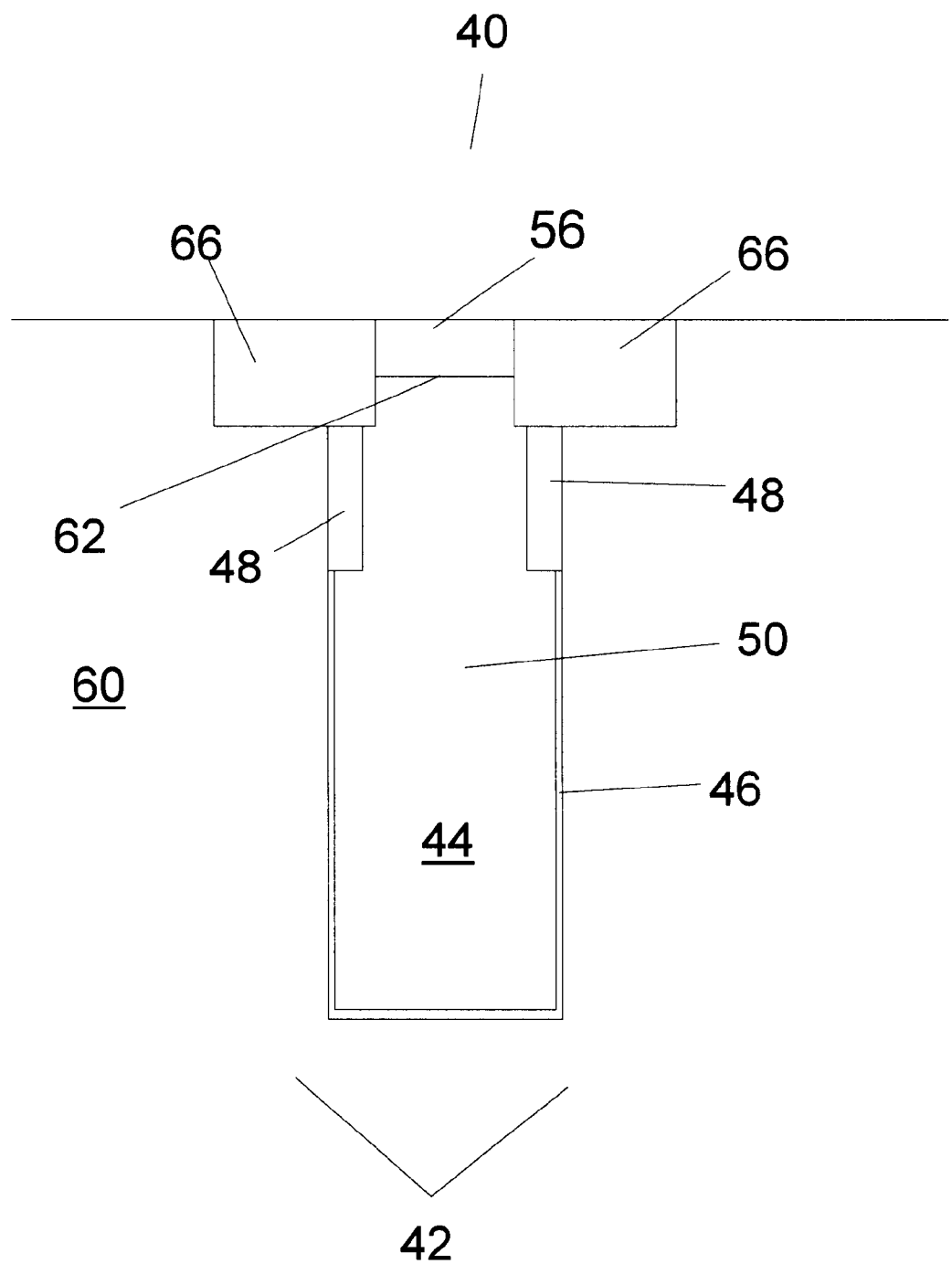
FIG. 3 is a schematic cross section of the deep trench capacitor structure of FIG. 1 at line B–B'.

FIG. 2 shows a schematic side view of the trench capacitor of FIG. 1. A buried plate electrode 42 is located about the exterior of a lower portion of the trench 44. A node dielectric 46 is present about the lower portion of the interior of trench 44. About the upper interior of trench 44 is an oxide collar 48. Trench 44 is filled with a conductive trench electrode material 50. A conductive strap 56 resides over and is electrically connected to trench electrode 50. Strap 56 thus provides electrical access to capacitor 40. While FIGS. 1–3 show a buried strap, the invention is not limited to any specific strap configuration. For example, the invention is equally applicable in the context of surface straps, lip straps (e.g., as disclosed in U.S. patent application Ser. No. 09/105,739, filed on Jun. 26, 1998, the disclosure of which is incorporated herein by reference) or other strap configurations.

The intrinsically conductive barrier layers of the invention may be located at one or more locations within the trench capacitor structure as desired to prevent unwanted interactions. For example, an intrinsically conductive barrier layer may be located at interface 58 between conductive strap 56 and substrate 60. Such an intrinsically conductive barrier layer would be useful in preventing or inhibiting undesired transmission of recrystallization forces from strap 56 and/or trench electrode 50 to substrate 60. An intrinsically conductive barrier layer may also be located at interface 62 between trench electrode 50 and strap 56. Such an intrinsically conductive barrier layer would also be useful in preventing or inhibiting undesired transmission of recrystallization forces from trench electrode 50 to strap 56 and substrate 60. The use of the intrinsically conductive barrier layers of the invention may also inhibit dopant diffusion from one side of the barrier layer to the other.

Where the intrinsically conductive barrier layer is formed by chemical vapor deposition, physical vapor deposition or sputtering, the layer may also optionally be present at the interface 64 between collar oxide 48 and strap 56.

The intrinsic compound conductor preferably has a bulk resistivity of less than about $10^{-1}$ ohm-m, more preferably about $10^{-6}$–$10^{-4}$ ohm-m. The intrinsically conductive barrier material is preferably a transition metal compound containing at least one element that is neither metallic nor metalloid. More preferably, the intrinsically conductive barrier material is a nitrogen-containing group IV(b)-VI(b) transition metal compound. Preferred transition metals are titanium or tungsten. Preferred intrinsically conductive materials are selected from the group consisting of transition metal nitrides and transition metal silicon nitrides.

The thickness of the intrinsically conductive barrier layer may be varied as long as the desired barrier function is obtained. Preferably, the intrinsically conductive barrier layer has a thickness of at least about 50 Å, more preferably at least about 100 Å, most preferably about 100–500 Å.

The intrinsically conductive barrier layer(s) preferably has a film resistance of less than about 1 K-ohm-$\mu m^2$, more preferably less than about 100 ohm-$\mu m^2$. The series resistance introduced by the intrinsically conductive barrier layer is equal to the film resistance (ohm-$\mu m^2$) divided by the cross sectional area ($\mu m^2$) of the intrinsically conductive barrier layer normal to the direction of current.

The invention is not limited to any specific material compositions for the various components of the trench capacitor. If desired, any of various materials described in the art may be used. Thus, the trench electrode 50 would typically be made of a doped polycrystalline silicon or other suitably conductive material. Strap 56 would typically be made of amorphous silicon. Substrate 60 would typically be a monocrystalline semiconductor material (most typically silicon, lightly doped silicon or silicon having lightly doped bands). The buried plate 42 is typically a high dopant (e.g., arsenic) region within the substrate. The collar 48 and shallow trench isolation 66 are typically a silicon dioxide.

The use of alternative or modified materials may be enabled by the presence of the intrinsically conductive barriers of the invention. For example, trench electrode materials having very high dopant levels may be used (e.g., $5 \times 10^{18}$–$10^{21}$, more preferably $5 \times 10^{19}$–$10^{20}$ dopant atoms per $cm^3$). If desired, the composition of the strap may be altered in the presence of suitable intrinsically conductive barrier layers.

The intrinsically conductive barrier layers of the invention may be made by various methods. The choice of method may depend on the composition of the surface on which the layer is to be formed and/or the desired intrinsically conductive barrier layer composition.

Where the surface on which the layer is to be formed has a high silicon content (e.g., a conventional (doped or undoped) polycrystalline, amorphous or monocrystalline silicon) and a silicon-containing intrinsically conductive barrier is desired, the intrinsically conductive barrier layer may be formed by reacting a portion of the silicon at the immediate surface with a nitrogen-containing compound in the atmosphere contacting the surface to form a silicon nitride layer (e.g., about 10 nm thick). A transition metal is then deposited on the silicon nitride layer and reacted with the silicon nitride layer to form the desired transition metal silicon nitride material.

Preferred nitrogen-containing compounds are those which are easily handled in a gaseous state. Examples of preferred nitrogen compounds are selected from the group consisting of ammonia, NO, $N_2O$ or (under plasma conditions) monatomic nitrogen. Ammonia is the most preferred nitrogen compound. The atmosphere may also contain one or more diluent gases such as $N_2$, helium or argon. The partial pressure of the nitrogen compound is preferably about 1–760 Torr, more preferably about 5–10 Torr. The reaction is typically facilitated by heating to a temperature of about 300–950° C. more preferably about 350–750° C. The reaction may be conducted until the desired layer thickness is formed. Preferably, the reaction is conducted for about 1–30 minutes, more preferably about 10–20 minutes.

The transition metal may be deposited for reaction using one of the deposition techniques mentioned below. The reaction to form the transition metal silicon nitride is preferably carried out at about 800–100° C. for about 10 seconds to 5 minutes in an inert ambient (e.g., $N_2$).

Alternatively, the intrinsically conductive barrier layer may be formed by chemical vapor deposition, plasma enhanced chemical vapor deposition, physical vapor deposition, collimated or non-collimated sputtering or other depostion technique. In such instances, the reactants for forming the intrinsically conductive barrier layer may be those typically used to form thin film layers of the desired material. Various methods for forming the desired thin films may be found in the "Fundamentals of Semiconductor Processing Technologies" by Badih El-Kareh, Kluwer Academic Press, (1995), especially Chapter 3, and in "Handbook of Thin Film Technology" by Maissel & Glang, McGraw-Hill Book Co. (1970) as well as in similar treatises. Examples of suitable layer formation processes are disclosed in U.S. Pat. Nos. 5,066,615; 5,487,923; and 5,796,166 the disclosures of which are incorporated herein by reference.

In the formation of metal silicon nitride barrier layers, preferred silicon reactant precursors are silane and dichlorosilane. Preferred transition metal reactant precursors are transition metal chlorides or fluorides.

If desired, the substrate may be pre-cleaned by a chemical etch (e.g. HF solution) and/or by a high temperature (e.g., about 900°–1000° C.) bake in a hydrogen atmosphere (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Trench capacitor structures containing the intrinsically conductive barrier layers of the invention may be formed by inserting one of the above layer formation techniques at an appropriate point(s) in the overall process of capacitor manufacturing process. The overall trench capacitor manufacturing process used may be any of those known in the art such as those described in the patents mentioned above. Alternatively, other variations on trench capacitor manufacturing processes may also be used (e.g., processes involving formation of collar oxides by the LOCOS technique).

One method of forming a deep trench capacitor in a monocrystalline semiconductor substrate, with intrinsically conductive barrier layers at both the interface of the strap and the substrate and the interface of the strap and the trench electrode, comprises:

(a) providing a monocrystalline semiconductor substrate having (i) a buried plate about an exterior portion of a trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) forming a layer of said intrinsically conductive barrier material on the exposed electrode and substrate surfaces, and (d) filling the space over the intrinsically conductive barrier material layer with a conductive strap material.

Preferably, a collar oxide is provided about the upper interior portion of the trench in step (a). Shallow trench isolation would typically be formed after filling step (d) by etching to define a space for the isolation and filling that space with the desired shallow trench isolation material. The intrinsically conductive barrier layer(s) is preferably formed in step (c) by one or more processes selected from the group consisting of chemical vapor deposition, physical vapor deposition, sputtering or other appropriate deposition technique.

Where an intrinsically conductive barrier layer is desired only at the interface of the strap and the trench electrode, a mask layer may be directionally deposited (e.g., by HDP deposition) over the layer formed in step (c) whereby the mask is thicker over the intrinsically conductive barrier layer on the trench electrode surface. This mask may be removed from the intrinsically conductive barrier layer on the substrate surface by isotropic etching (with partial reduction in thickness of the mask over the intrinsically conductive barrier layer on the trench electrode surface). The intrinsically conductive barrier layer on the substrate surface is then preferably removed by a selective isotropic etch to re-expose the substrate surface first exposed in step (b). The remaining mask over the intrinsically conductive barrier layer on the trench electrode surface may then by removed by a further selective etch process. The process could then continue with filling step (d).

Alternatively, a deep trench capacitor according to the invention with an intrinsically conductive barrier layer at the interface of the strap and the trench electrode may be formed by:

(a) providing a monocrystalline semiconductor substrate having (i) a buried plate in an exterior portion of trench in the substrate, (ii) a node dielectric about at least a lower interior portion of the trench, and (iii) an electrode in the trench, (b) removing an upper portion of the electrode to provide space for a conductive strap, thereby exposing electrode and substrate surface, (c) directionally depositing an intrinsically conductive barrier layer on the electrode surface, (d) isotropically etching the intrinsically conductive barrier layer to remove any intrinsically conductive barrier material deposited on the exposed substrate surface, thereby leaving an intrinsically conductive barrier layer on the electrode surface only, and (e) filling the space formed in step (b) with a conductive strap material.

Preferably, a collar oxide is provided about the upper interior portion of the trench in step (a). Shallow trench isolation would typically be formed after filling step (e) by etching to define a space for the isolation and filling that space with the desired shallow trench isolation material.

Where a surface strap is used, the above processes would be modified by eliminating steps for forming space for the buried strap. Where a trench capacitor formation process does not naturally provide the surface where an intrinsically conductive barrier is desired, such a process can be modified by adding appropriate etch back, layer formation and fill steps, the etch and fill steps being selected from those known in the art for the specific materials involved.

What is claimed is:

1. A deep trench capacitor in a monocrystalline semiconductor substrate, said capacitor comprising (i) a buried plate in said substrate about an exterior portion of a trench in said substrate, (ii) a node dielectric about at least a lower interior portion of said trench, (iii) an electrode in said trench, and (iv) a conductive strap extending away from said trench electrode, the conductive strap being electrically connected to the trench electrode and the monocrystalline substrate, said capacitor further comprising (v) an intrinsically conductive barrier layer located at an interface with said conductive strap said interface being selected from the group consisting of (a) an interface between said conductive strap and said monocrystalline substrate or (b) an interface between said conductive strap and said trench electrode.

2. The capacitor of claim 1 further comprising an oxide collar about an upper interior region of said trench.

3. The capacitor of claim 1 wherein said intrinsically conductive barrier layer is located at said interface between said trench electrode and said conductive strap.

4. The capacitor of claim 3 wherein said intrinsically conductive barrier layer is substantially coextensive with said interface.

5. The capacitor of claim 3 further comprising an additional intrinsically conductive barrier layer located at an interface between said conductive strap and said monocrystalline substrate.

6. The capacitor of claim 1 wherein said intrinsically conductive barrier layer is located at said interface between said conductive strap and said monocrystalline substrate.

7. The capacitor of claim 6 wherein said intrinsically conductive barrier layer is substantially coextensive with said interface.

8. The capacitor of claim 1 wherein said intrinsically conductive barrier layer is a material selected from the group consisting of transition metal nitrides and transition metal silicon nitrides.

9. The capacitor of claim 1 wherein said intrinsically conductive barrier layer has a thickness of at least about 100 Å.

10. The capacitor of claim 1 wherein said intrinsically conductive barrier layer has a thickness of about 100–500 Å.

11. The capacitor of claim 1 wherein said conductive strap is a buried strap.

12. The capacitor of claim 1 wherein said conductive strap comprises amorphous silicon.

13. The capacitor of claim 1 wherein said trench electrode comprises doped polycrystalline silicon.

14. The capacitor of claim 1 wherein said monocrystalline semiconductor comprises undoped silicon or lightly doped silicon.

* * * * *